US012563974B2

(12) United States Patent
Sun

(10) Patent No.: US 12,563,974 B2
(45) Date of Patent: Feb. 24, 2026

(54) MAGNETORESISTIVE DEVICES AND METHODS THEREFOR

(71) Applicant: Everspin Technologies, Inc., Chandler, AZ (US)

(72) Inventor: Jijun Sun, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 18/665,145

(22) Filed: May 15, 2024

(65) Prior Publication Data

US 2024/0306516 A1     Sep. 12, 2024

Related U.S. Application Data

(63) Continuation of application No. 17/285,364, filed as application No. PCT/US2019/056757 on Oct. 17, 2019, now Pat. No. 12,022,741.

(60) Provisional application No. 62/747,441, filed on Oct. 18, 2018.

(51) Int. Cl.
| | |
|---|---|
| *H10N 50/10* | (2023.01) |
| *G11C 11/16* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC .......... *H10N 50/10* (2023.02); *G11C 11/161* (2013.01); *H10B 61/20* (2023.02); *H10N 50/01* (2023.02); *H10N 50/80* (2023.02); *H10N 50/85* (2023.02)

(58) Field of Classification Search
CPC ........ H10N 50/10; H10N 50/80; H10N 50/01; H10N 50/85; H10B 61/20; G11C 11/161
USPC ......................................................... 257/421
See application file for complete search history.

(56) References Cited

U.S. PATENT DOCUMENTS

| | | | | |
|---|---|---|---|---|
| 7,944,738 | B2 * | 5/2011 | Liu ..................... | H01F 10/3254 |
| | | | | 365/158 |
| 12,108,683 | B2 * | 10/2024 | Hong .................... | G11C 11/161 |
| 2009/0006050 | A1 * | 1/2009 | Chen ....................... | G06F 30/33 |
| | | | | 703/4 |
| 2011/0140217 | A1 * | 6/2011 | Nguyen .................. | G11C 11/16 |
| | | | | 257/E29.323 |
| 2013/0032911 | A1 | 2/2013 | Jung et al. | |
| 2013/0334631 | A1 | 12/2013 | Kinney et al. | |
| 2015/0129996 | A1 | 5/2015 | Tang et al. | |
| 2015/0287450 | A1 * | 10/2015 | Prejbeanu ........... | G11C 11/5607 |
| | | | | 365/158 |

(Continued)

OTHER PUBLICATIONS

International Search Report and Written Opinion in International Application No. PCT/US2019/056757, mailed Jan. 22, 2020 (20 pages).

*Primary Examiner* — Jami Valentine Miller
(74) *Attorney, Agent, or Firm* — Bookoff McAndrews, PLLC

(57) ABSTRACT

Aspects of the present disclosure are directed to magnetoresistive stacks including regions having increased height-to-diameter ratios. Exemplary magnetoresistive stacks (for example, used in a magnetic tunnel junction (MTJ) magnetoresistive device) of the present disclosure include one or more multilayer synthetic antiferromagnetic structures (SAFs) or synthetic ferromagnetic structures (SyFs) in order to promote stability of the SAF or SyF, e.g., for smaller-sized MTJs.

20 Claims, 11 Drawing Sheets

(56)                    References Cited

U.S. PATENT DOCUMENTS

| | | | | |
|---|---|---|---|---|
| 2016/0233418 | A1* | 8/2016 | Park | H10N 50/85 |
| 2019/0173001 | A1* | 6/2019 | Lee | H10N 50/85 |
| 2020/0312908 | A1* | 10/2020 | Oguz | H10N 50/85 |
| 2021/0126190 | A1* | 4/2021 | Couet | H10N 50/85 |
| 2023/0380297 | A1* | 11/2023 | Sun | H10N 50/85 |

* cited by examiner

CONDUCTOR (BITLINE)

ELECTRICALLY
CONDUCTIVE
ELECTRODE

MAGNETORESISTIVE
STACK/STRUCTURE

ELECTRICALLY
CONDUCTIVE
ELECTRODE

CONDUCTOR
(WORD LINE)

ACCESS TRANSISTOR

CONDUCTOR (SOURCE LINE)

DISCRETE MEMORY DEVICE

EMBEDDED MEMORY DEVICE

MAGNETORESISTIVE DEVICES AND METHODS THEREFOR

CROSS-REFERENCE TO RELATED APPLICATIONS

This application is a continuation of U.S. patent application Ser. No. 17/285,364, filed on Apr. 14, 2021, which is a U.S. national phase entry under 35 U.S.C. § 371 of International Application No. PCT/US2019/056757, filed on Oct. 17, 2019, which claims priority to U.S. Provisional Application No. 62/747,441, filed on Oct. 18, 2018, which is incorporated by reference herein in its entirety.

TECHNICAL FIELD

The present disclosure relates to, among other things, magnetoresistive stacks and structures, devices including the disclosed magnetoresistive stacks and structures, and methods for fabricating and using the disclosed magnetoresistive stacks and structures.

INTRODUCTION

There are many inventions described and illustrated herein, as well as many aspects and embodiments of those inventions. In one aspect, the present disclosure relates to a magnetoresistive stack (for example, part of a magnetoresistive memory device, magnetoresistive sensor/transducer device, etc.) and methods of manufacturing the described magnetoresistive stacks. Exemplary magnetoresistive stacks (for example, used in a magnetic tunnel junction (MTJ) magnetoresistive device) of the present disclosure include one or more multilayer synthetic antiferromagnetic structures (SAFs) or synthetic ferromagnetic structures (SyFs) in order to promote stability of the SAF or SyF, e.g., for smaller-sized MTJs.

Briefly, a magnetoresistive stack used in a memory device (e.g., a magnetoresistive random access memory (MRAM)) includes at least one non-magnetic layer (for example, at least one dielectric layer or a non-magnetic yet electrically conductive layer) disposed between a "fixed" magnetic region (hereinafter referred to as a "fixed region") and a "free" magnetic region (hereinafter referred to as a "free region"), each including one or more layers of ferromagnetic materials. Information may be stored in the magnetoresistive memory stack by switching, programming, and/or controlling the direction of magnetization vectors in the magnetic layer(s) of the free region. The direction of the magnetization vectors of the free region may be switched and/or programmed (for example, through spin transfer torque (STT), spin-orbit-torque (SOT), etc.) by application of a write signal to the magnetoresistive memory stack (e.g., directing one or more current pulses through the magnetoresistive memory stack or spin-hall material, etc.). In contrast, the magnetization vectors in the magnetic layers of a fixed region are magnetically fixed in a predetermined direction. When the magnetization vectors of the free region adjacent to the non-magnetic layer are in the same direction as the magnetization vectors of the fixed region adjacent to the non-magnetic layer, the magnetoresistive memory stack has a first magnetic state and a corresponding first electrical resistance state (e.g., a low resistance state). Conversely, when the magnetization vectors of the free region adjacent to the non-magnetic layer are opposite the direction of the magnetization vectors of the fixed region adjacent to the non-magnetic layer, the magnetoresistive memory stack has a second magnetic state and a corresponding second electrical resistance state (e.g., a high resistance state). The magnetic state of the magnetoresistive memory stack is determined or read by detecting the resistance of the stack (e.g., by directing a "read current" through the stack).

It should be noted that, although exemplary embodiments in the disclosure are described and/or illustrated herein in the context of MTJ stacks/structures, embodiments may also be implemented in giant magnetoresistive (GMR) stacks/structures where a conductor (e.g., copper) is disposed between two ferromagnetic regions/layers/materials. Indeed, embodiments of the present disclosure may also be employed in connection with other types of magnetoresistive stacks (and/or structures) wherein such stacks include a fixed region, a free region, an intermediate region, etc. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

As magnetic memory devices (e.g., MRAM) advance towards smaller process nodes to, for example, increase density, individual MTJ bit sizes (e.g., diameters) must laterally shrink to accommodate tighter pitch and space between bits. However, as the size and/or aspect ratio of the MTJ bit decreases, so does its shape magnetic anisotropy. With the decrease in shape anisotropy, the energy barrier of the MTJ also may decrease. As the energy barrier decreases, however, the data retention and/or thermal stability of the MTJ bit also may decrease or otherwise become compromised. Typically, the decrease in energy barrier of the MTJ bit may be corrected (or otherwise compensated for) by increasing the perpendicular anisotropy or magnetic moment of the free region by, e.g., altering its composition or the thickness of the free region. However, doing so also may raise the critical current of the MTJ bit. MTJ bits with high critical currents undergo a greater amount of periodic damage and degeneration during write and/or reset operations. Similarly, the fixed region should be magnetically stable even at smaller MTJ sizes, e.g., to prevent fixed region magnetization flip due to an unstable SAF or at reflow process for an MRAM device, which requires high magnetic anisotropy or coupling strength between two magnetic layers in a SAF structure.

Embodiments of the present disclosure may be drawn to devices and methods for increasing stability of synthetic antiferromagnetic structures (SAFs), e.g., in smaller-sized MTJ bits, e.g., MTJ bits with relatively smaller diameters. The scope of the current disclosure, however, is defined by the attached claims, and not by any characteristics of the resulting device or method.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For case of illustration, the figures depict the different layers/regions of the illustrated magnetoresistive stacks as having a uniform thickness and well-defined boundaries with straight edges. However, a person skilled in the art would recognize that, in reality, the different layers may have a non-uniform thickness. And, at the interface between adjacent layers, the materials of these layers may alloy together, or migrate into one or the other material, making their boundaries ill-defined and/or diffuse. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations. Rather, it is intended to reflect or indicate that so described embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks may have a different order (e.g., the opposite order (i.e., from top to bottom)). For example, a fixed region may be formed on or above a free region, which in turn may be formed on or above an insertion layer of the present disclosure.

Figure 1:
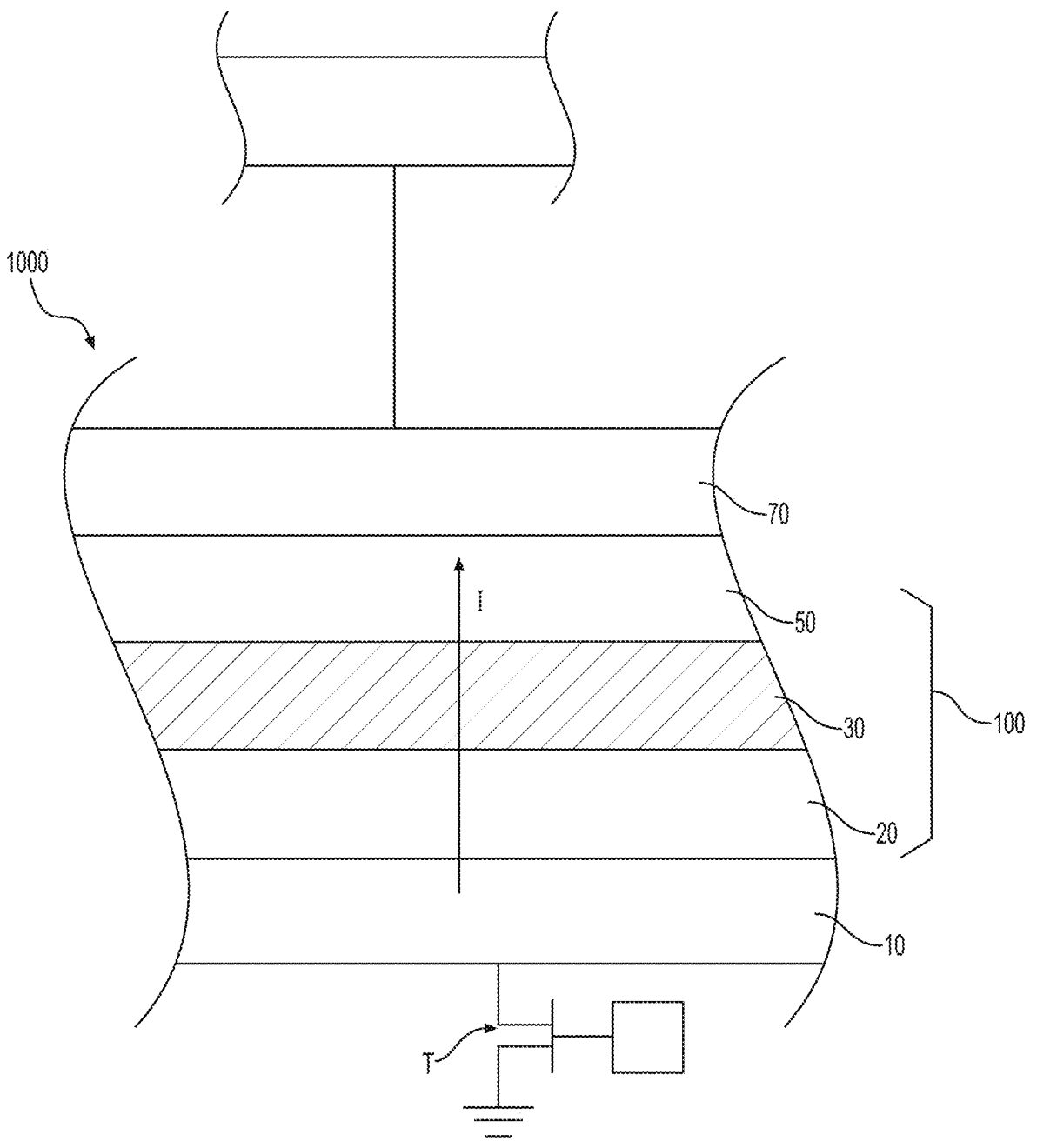
Figure 2:
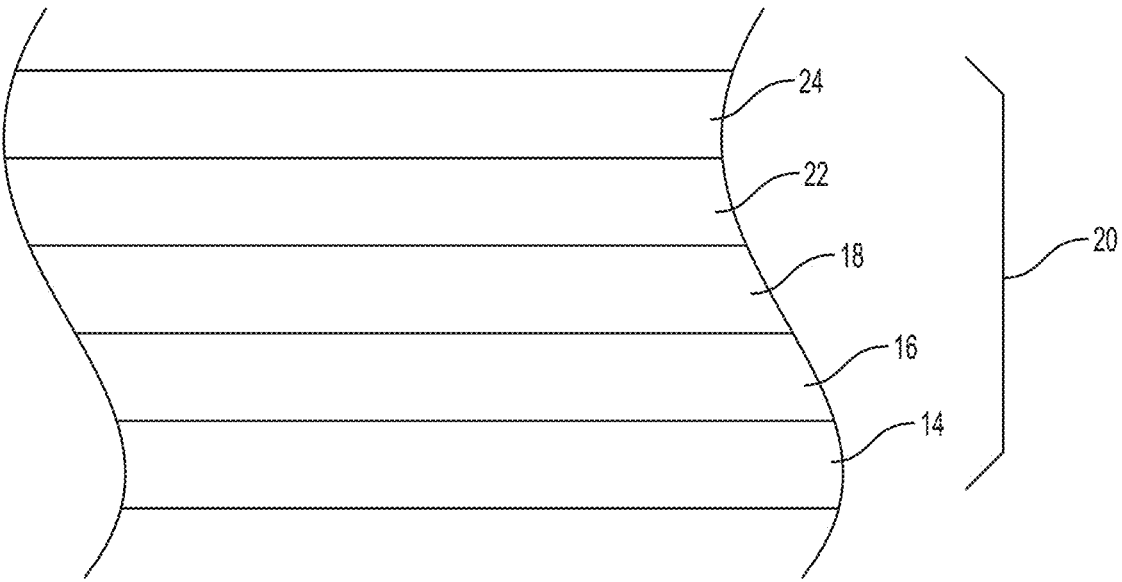
Figure 3A:
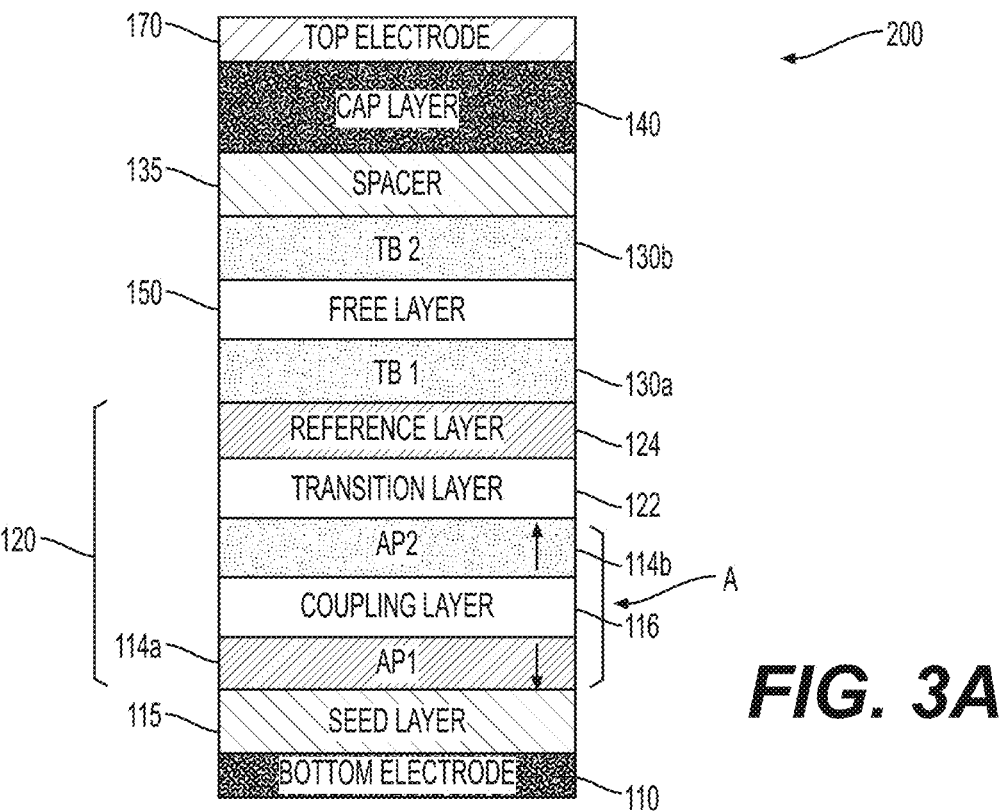
Figure 3B:
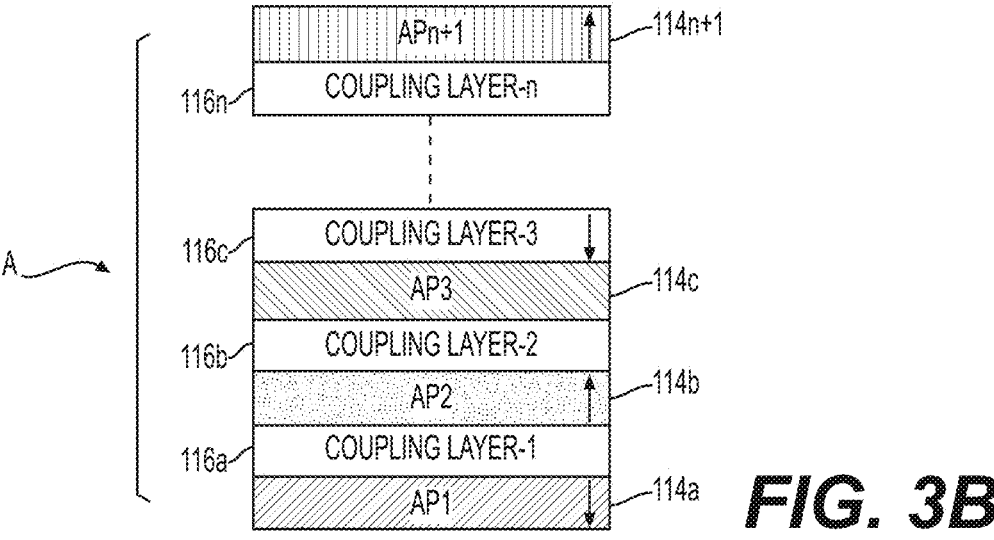
Figures 4A, 4B, 4C:
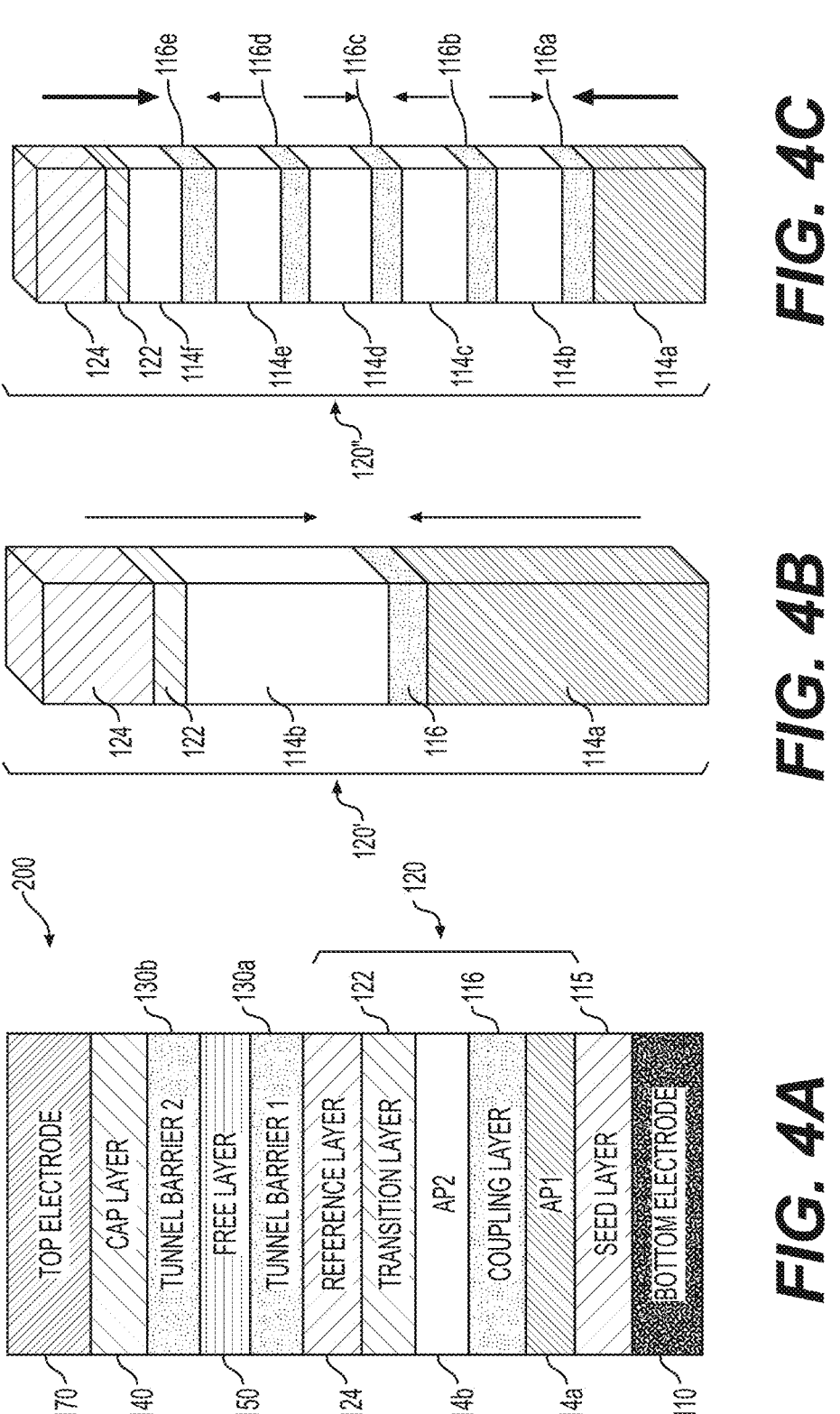
Figure 5:
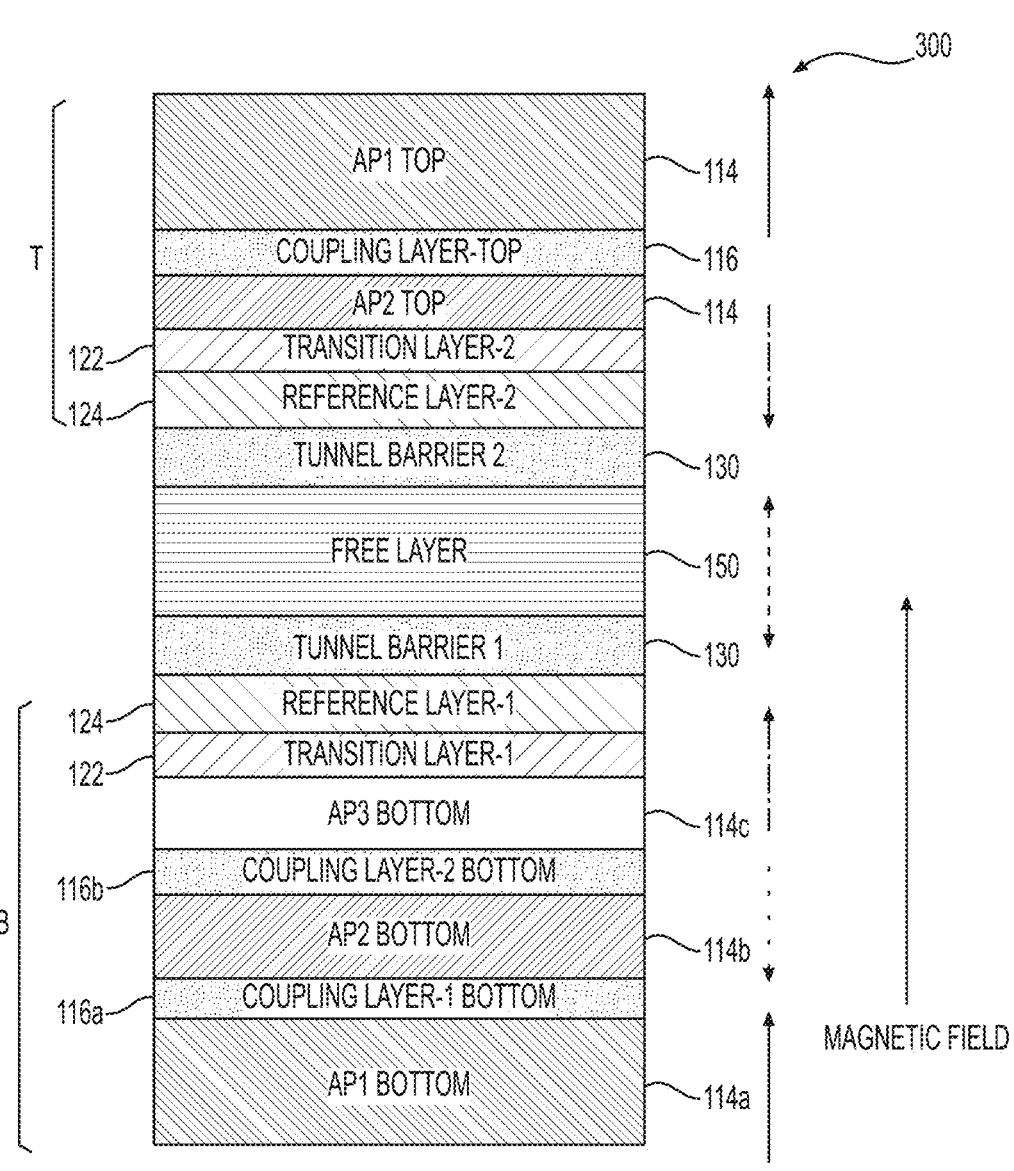
Figure 7:
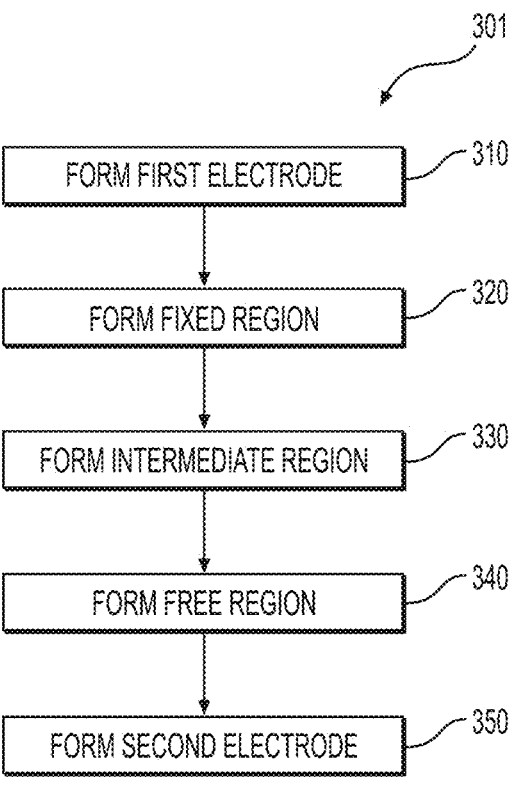
Figure 8:
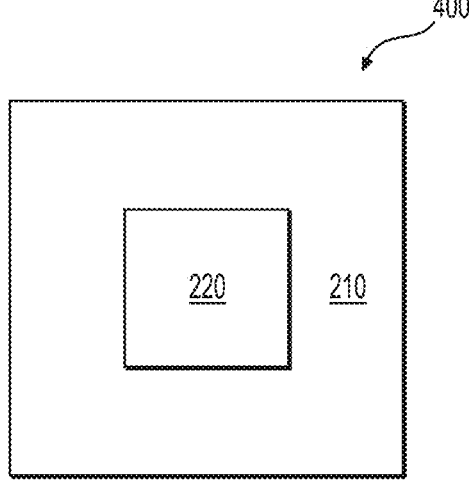

FIG. 1 illustrates a cross-sectional view depicting various regions of an exemplary MTJ bit, according to an embodiment of the present disclosure;

FIG. 2 illustrates a cross-sectional view depicting an exemplary fixed region of the MTJ bit of FIG. 1, according to an embodiment of the present disclosure;

FIG. 3A illustrates a cross-sectional view depicting various regions of an exemplary MTJ bit, according to an embodiment of the present disclosure;

FIG. 3B illustrates a cross-sectional view depicting an exemplary fixed region of the MTJ bit of FIG. 3A, according to an embodiment of the present disclosure;

FIG. 4A illustrates a cross-sectional view depicting various regions of an exemplary MTJ bit, according to an embodiment of the present disclosure;

FIG. 4B illustrates a cross-sectional view depicting an exemplary fixed region of the MTJ bit of FIG. 4A, according to an embodiment of the present disclosure;

FIG. 4C illustrates a cross-sectional view depicting an exemplary fixed region of the MTJ bit of FIG. 4A, according to an embodiment of the present disclosure;

FIG. 5 illustrates a cross-sectional view depicting various regions of an exemplary MTJ bit, according to an embodiment of the present disclosure;

FIGS. 6A-6H illustrate cross-sectional vies depicting exemplary free regions of the MTJ bits of FIGS. 4A and 5;

FIG. 7 is a simplified flow chart illustrating an exemplary method of fabricating exemplary magnetoresistive devices, according to an embodiment of the present disclosure;

FIG. 8 is a schematic diagram of an exemplary integrated circuit (IC) device that includes a logic portion and a magnetoresistive device portion.

Figure 9:
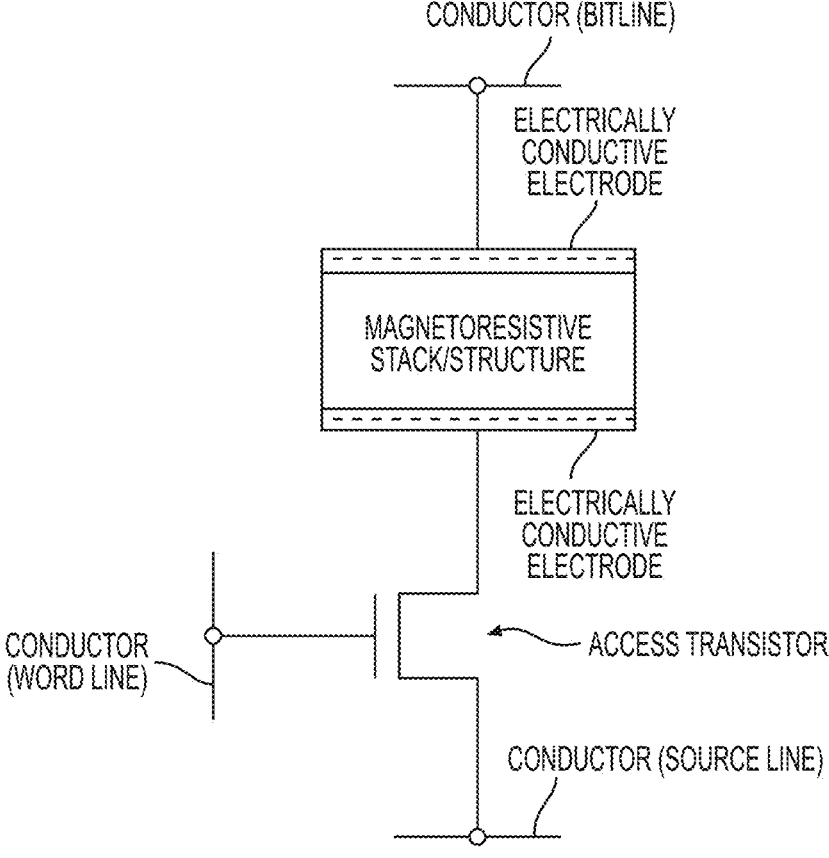
Figure 10A:
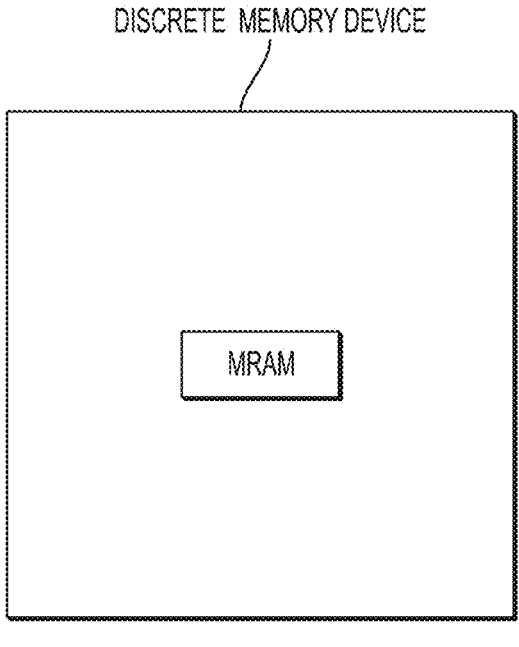
Figure 10B:
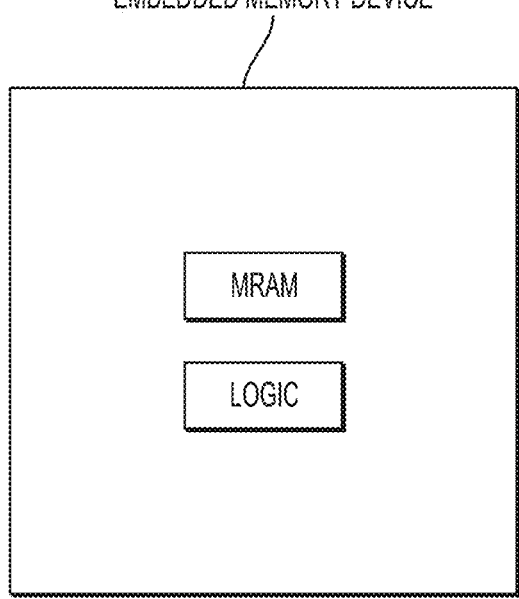

FIG. 9 is a schematic diagram of an exemplary magnetoresistive memory stack electrically connected to a select device, e.g., an access transistor, in a magnetoresistive memory cell configuration; and FIGS. 10A-10B are schematic block diagrams of integrated circuits including a discrete memory device and an embedded memory device, respectively, each including an MRAM (which, in one embodiment is representative of one or more arrays of MRAM having a plurality of magnetoresistive memory stacks according to aspects of certain embodiments of the present disclosure).

As explained previously, although individual layers and/or regions of cross-sectional figures, e.g., FIGS. 1, 2, 3A, 3B, 4A-4C, 5, and 6A-6H, are illustrated as distinct layers with sharp, well-defined boundaries, typically, the materials of two adjacent layers at an interface (between the layers) may diffuse into each other over time and/or exposure to high temperature, and present an interfacial region of an alloy or a combination of the materials of the two individual layers. Thus, while all of the layers or regions of these figures may be present and distinguishable immediately after formation of these layers or regions, in some embodiments, it may be difficult to distinguish some of these regions in a cross-section. In some embodiments, some of these layers may appear as an interfacial region having a higher concentration of an element or a material.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by interlayer diffusion, etc.) after further processing (e.g., exposure to high temperatures, etc.).

Unless defined otherwise, all terms of art, notations and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein are incorporated by reference in their entirety. If a definition or description set forth in this disclosure is contrary to, or otherwise inconsistent with, a definition and/or description in these references, the definition and/or description set forth in this disclosure prevails over those in the references that are incorporated herein by reference. None of the references described or referenced herein is admitted to be prior art to the current disclosure.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, some of the regions and/or layers of the disclosed magnetoresistive stacks are referred to by specific names (capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the free region is depicted as being above an intermediate region, in some aspects the entire magnetoresistive stack may be flipped such that the intermediate region is above the free region.

In one exemplary aspect, the magnetoresistive stack of the present disclosure may be implemented as a spin-torque magnetoresistive random access memory ("MRAM") element ("memory element"). In such aspects, the magnetoresistive stack may include an intermediate region positioned (or sandwiched) between two ferromagnetic regions to form a magnetic tunnel junction (MTJ) device (or an MTJ-type device). In MTJ devices, the intermediate region may be a tunnel barrier and may include an insulating material, such as, e.g., a dielectric material. However, as previously explained, although not expressly described herein, in other embodiments the intermediate region may be a conductive material, e.g., copper, gold, or alloys thereof. In such other embodiments, where the magnetoresistive stack includes a conductive material positioned between two ferromagnetic regions to form a giant magnetoresistance (GMR), or GMR-type, device.

Of the two ferromagnetic regions disposed on either side of the intermediate region, one ferromagnetic region may be a magnetically "fixed" (or "pinned") region, and the other ferromagnetic region may be a magnetically "free" region. The term "free" is intended to refer to ferromagnetic regions having a magnetic moment vector that may change or move significantly in response to applied magnetic fields or spin-polarized currents used to switch the magnetic moment vector. On the other hand, the words "fixed" and "pinned" are used to refer to ferromagnetic regions having a magnetic moment vector that does not move substantially in response to such applied magnetic fields or spin-polarized currents. The direction of the magnetization vectors of the free magnetic region may be switched and/or programmed (for example, through spin transfer torque (STT), spin orbit torque (SOT), or a magnetic field generated by electrical current passing through a nearby conductor) by application of a write signal (e.g., one or more current pulses) to the magnetoresistive memory stack. As is known in the art, an electrical resistance of the described magnetoresistive stack may change based on whether the magnetization direction (e.g., the direction of the magnetic moment) of the free region adjacent to the non-magnetic layer is in a parallel alignment (P) or in an antiparallel alignment (AP) with the magnetization direction (e.g., the direction of the magnetic moment) of the fixed region adjacent to the non-magnetic layer. Typically, if the two regions have the same magnetization alignment (i.e., in the P magnetic state), the resulting relatively low(er) resistance (RI) is considered as a digital "0," while if the alignment is antiparallel (i.e., in the AP magnetic state) the resulting relatively high(er) resistance ($R_H$) is considered to be a digital "1." A memory device (such as an MRAM) may include multiple such magnetoresistive stacks, which may be referred to as memory cells or elements, arranged in an array of columns and rows. By measuring the current through each cell, the resistance of each cell, and thus the data stored in the memory array can be "read."

Magnetoresistance ratio (MR) is the ratio of the change in resistance of a magnetoresistive stack between its high and low resistance states $MR=(R_H-R_L)/R_L$, where $R_L$ and $R_H$ are the resistances of the magnetoresistive stack in the low and high resistance states, respectively. MR is indicative of the strength of the signal when a memory element is "read." For an MTJ-type magnetoresistive stack with a strong read signal, a larger MR (e.g., a larger difference between the individual resistances $R_H$ and $R_L$) is desirable. When the intermediate layer of magnetoresistive stack is a tunnel barrier made of a dielectric material, the resistance may be measured by the resistance-area product (RA).

FIG. 1 is a cross-sectional view of a portion of an exemplary MTJ device 1000 having an exemplary MTJ bit 100. MTJ bit 100 may be coupled or otherwise connected to an access transistor T (or other suitable select devices, such as, e.g., a diode) and to various conductors (e.g., source line conductor, word line conductor, bit line conductor, etc.), which may carry one or more control signals and provide access to MTJ bit 100 (e.g., to read and write MTJ bit 100). MTJ device 1000 may be used in any suitable application, including, e.g., in a memory configuration. MTJ bit 100 may include a magnetoresistive stack having a plurality of layers and/or regions stacked one over the other. As illustrated in FIG. 1, the magnetoresistive stack of MTJ bit 100 includes an intermediate region 30 (which in an MTJ device includes a dielectric material and functions as a tunnel barrier) positioned between a fixed region 20 and a free region 50. In some embodiments, as illustrated in FIG. 1, MTJ bit 100 may be formed between a first electrode 10 (e.g., a bottom electrode) and a second electrode 70 (e.g., a top electrode). First and second electrodes 10, 70 may comprise an electrically conductive material, and may be part of (or be in physical contact with) electrically conductive interconnects (e.g., vias, traces, lines, etc.) of MTJ device 1000. Although any electrically conductive material may be used for first and second electrodes 10, 70, in some embodiments, a metal such as tantalum (Ta), titanium (Ti), tungsten (W), or a composite or alloy of these elements (e.g., tantalum-nitride alloy) may be used. In some embodiments, first and/or second electrodes 10, 70 may be eliminated, and MTJ bit 100 may be in direct contact with a metallization structure (e.g., line, via, etc.) of MTJ device 1000.

Although not illustrated in FIG. 1, electrode 10 may be formed on a planar surface of a semiconductor substrate (e.g., silicon substrate, etc.) having IC devices (e.g., CMOS devices, such as, for example, transistors, etc.) formed thereon. In some embodiments, first electrode 10 may include a seed layer at its interface with the overlying region (e.g., fixed region 20). During fabrication, the seed layer may assist in the formation of the overlying region on electrode 10. The seed layer may include one or more of nickel (Ni), chromium (Cr), cobalt (Co), iron (Fe), ruthenium (Ru), platinum (Pt), tantalum (Ta), and alloys thereof (for example, an alloy including nickel (Ni) and/or chromium (Cr)). In some embodiments, the seed layer may be eliminated, and the top surface of electrode 10 itself may act as the seed layer.

With reference to FIG. 2, in some embodiments, fixed region 20 may include a plurality of layers. It should be noted that, for the sake of clarity, only certain layers that comprise the fixed region 20 are illustrated in FIG. 2. Those of ordinary skill in the art will readily recognize that one or more additional layers, interface areas, and/or regions may be included within fixed region 20 and/or may be disposed between the layers of fixed region 20 and the depicted exemplary regions on either side of fixed region 20. Fixed region 20 may be a fixed, unpinned synthetic antiferromagnetic (SAF) region disposed on or above electrode 10. The fixed, unpinned SAF region may include at least two magnetic regions 14, 18 (e.g., ferromagnetic regions) separated by a coupling region 16. Ferromagnetic regions 14, 18 may sometimes be referred to as Anti-Parallel layer 1 (AP1) and Anti-Parallel layer 2 (AP2), respectively. Although two magnetic regions 14, 18 are depicted in FIG. 2, in some embodiments, as will be described in more detail later with reference to FIGS. 3A, 3B, 4A-4C, and 5, fixed region 20 may include a plurality of repeating ferromagnetic (i.e., AP1 and AP1) regions and coupling regions to form a tall SAF region. As used herein, the word "tall" refers to a SAF region having a height that is similar to or greater than a width, i.e., a vertical dimension in a direction perpendicular to a substrate relative to a lateral dimension of the MTJ bit. Ferromagnetic regions 14, 18 may include one or more of the ferromagnetic elements nickel (Ni), iron (Fe), and cobalt (Co), including alloys or engineered materials with one or more of the elements palladium (Pd), platinum (Pt), nickel (Ni), and alloys thereof, and the coupling region 16 may be an antiferromagnetic (AF) coupling region that includes non-ferromagnetic materials such as, for example, iridium (Ir), ruthenium (Ru), rhenium (Re), or rhodium (Rh).

In some embodiments, one or both of ferromagnetic regions 14, 18 may comprise a magnetic multi-layer structure that includes a plurality of layers of a first ferromagnetic material (e.g., cobalt (Co)) and a second ferromagnetic material (e.g., nickel (Ni)) or a paramagnetic material (e.g., platinum (Pt)). In some embodiments, ferromagnetic regions 14, 18 may also include, for example, alloys or engineered materials with one or more of palladium (Pd), platinum (Pt), magnesium (Mg), manganese (Mn), and chromium (Cr). Additionally, or alternatively, in some embodiments, fixed region 20 may include one or more synthetic ferromagnetic structures (SyF). In some embodiments, fixed region 20 may have a thickness in the range of approximately 8 Å and approximately 300 Å, approximately 15 Å and approximately 110 Å, greater than or equal to 8 Å, greater than or equal to 15 Å, less than or equal to 300 Å, or less than or equal to 110 Å. Embodiments of the present disclosure having multiple SAF layers will be described in further detail below.

In some embodiments, as shown in FIG. 2, fixed region 20 may also include one or more additional layers, such as, for example, a transition region 22 and/or a reference region 24 disposed at the interface between fixed region 20 and the overlying region (e.g., region 30 of FIG. 1). Transition and/or reference regions 22, 24 may include one or more layers of material that, among other things, facilitate/improve growth of the overlying intermediate region 30 during fabrication. In one embodiment, reference region 24 may comprise one or more (e.g., all) of cobalt (Co), iron (Fe), and boron (B) (for example, in an alloy-such as an amorphous alloy (e.g., CoFeB or CoFeBTa or CoFcTa)). And, transition region 22 may include a non-ferromagnetic transition metal such as tantalum (Ta), titanium (Ti), tungsten (W), ruthenium (Ru), niobium (Nb), zirconium (Zr), and/or molybdenum (Mo), or their alloys. In general, transition region 22 and reference region 24 may have any thickness. In some embodiments, a thickness (t) of reference region 24 may be approximately 6-13 Å, preferably approximately 8-12 Å, and more preferably approximately 9-11 Å, and the thickness of transition region 22 may be approximately 1-8 Å, preferably approximately 1.5-5 Å, and more preferably approximately 2.5-3.5 Å. It should be noted that, in some embodiments, both transition region 22 and reference region 24 may be provided in fixed region 20 of MTJ bit 100. In some embodiments, transitional region 22 may be eliminated.

As explained previously, although FIG. 2 (and FIG. 1) shows the different regions of the stack as distinct layers, this is only a simplification. For example, although the different regions of the fixed region 20 of FIG. 2 may be sequentially and individually formed (e.g., deposited, deposited, and oxidized, etc.) during fabrication, as would be recognized by those of ordinary skill in the art, the materials that make up the various regions may alloy with (e.g., intermix with, diffuse into, etc.) the materials of adjacent regions during subsequent processing (e.g., high temperature processing operations, such as, annealing, etc.). Therefore, a person skilled in the art would recognize that, although the different regions of fixed region 20 of FIG. 2

(and of MTJ device 100 of FIG. 1) may appear as separate regions with distinct interfaces immediately after formation of these regions, after subsequent processing operations, the materials of the different regions may alloy together to form a single alloyed fixed region 20 having a higher concentration of different materials at interfaces between different regions. Thus, in some cases, it may be difficult to distinguish the different regions of the fixed region 20 (and other regions) in a finished MTJ bit 100 and MTJ device 1000.

With renewed reference to FIG. 1, a free region 50, or storage region, may be provided "above" fixed region 20 with an intermediate region 30 formed between fixed and free regions 20, 50. The relative orientation of fixed and free regions 20, 50 depicted in FIG. 1 is only exemplary, and those of ordinary skill will readily recognize that free region 50 may also be provided below fixed region 20. As explained previously, the type of intermediate region 30 formed depends upon the type of device being fabricated. In an MTJ bit, intermediate region 30 may include a dielectric material that functions as a tunnel barrier of MTJ bit 100. Intermediate region 30 may be formed on (or above) a surface of fixed region 20, and free region 50 may be formed on (or above) a surface of intermediate region 30. In general, intermediate region 30 may be formed on or above fixed region 20 using any technique now known (e.g., deposition, sputtering, evaporation, etc.) or later developed. In some embodiments, intermediate region 30 may include an oxide material, such as, for example, Magnesium Oxide (MgOx) or Aluminum Oxide (AlOx (e.g., $Al_2O_3$)), and may be formed by multiple steps of material deposition and oxidation. An exemplary method of forming intermediate region 30 is described in U.S. patent application Ser. No. 15/957,333, filed on Apr. 19, 2018, the entirety of which is herein incorporated by reference.

In general, intermediate region 30 may have any thickness. In some embodiments, intermediate region 30 may have a thickness of approximately 8.5-14.1 Å, preferably approximately 9.6-13.0 Å, and more preferably approximately 9.8-12.5 Å. In some embodiments, intermediate region 30 may have a thickness of approximately 3-14 Å, or approximately 5-12 Å, or approximately 6-10 Å. Although not illustrated in FIG. 1, in some embodiments, a dusting of an interfacial material (e.g., iron (Fe), cobalt-iron-alloy (CoFe) etc.) may also be provided at the interface between free region 50 and intermediate region 30. This interfacial material, deposited as, e.g., a discontinuous patchwork of material (as opposed to a continuous layer that would break exchange between the mating layers), may result in a relatively high(er) perpendicular magnetic anisotropy (PMA) of the resulting MTJ bit 100. In some embodiments, a dusting of an interfacial material (e.g., cobalt (Co), iron (Fe), or their alloys etc.) may also be provided at the interface between the fixed region 20 and the intermediate region 30.

With renewed reference to FIG. 1, free region 50 may include any ferromagnetic alloy. In some embodiments, the ferromagnetic alloy of free region 50 may comprise cobalt (Co), iron (Fe), and boron (B) (referred to as CoFeB). It should be noted that the configuration of free region 50 illustrated in FIG. 1 is only exemplary, and many other configurations are possible. Notwithstanding the specific configuration of free region 50, as explained previously, a magnetic vector (or moment) in free region 50 may be moved or switched by applied magnetic fields or spin torque currents. Although free region 50 is illustrated as a single layer in FIG. 1, this is only exemplary. Similar to fixed region 20, free region 50 may also include multiple layers stacked one over the other.

In spin-torque transfer (STT) MTJ devices, switching the magnetization direction of the free region 50 is accomplished by driving an electrical current pulse (I) through the stack. The polarity of the current pulse (I) determines the final magnetization state (i.e., P or AP) of the free region. For example, directing a current I of sufficient magnitude in one direction (e.g., from the fixed region 20 towards the free region 50) may switch free region 50 to the AP state (i.e., cause the magnetization state of the free region to be antiparallel with the magnetization state of the fixed region). And, directing a tunneling current (I) in the opposite direction (e.g., from the free region towards the fixed region) may change the magnetization state of the free region to be parallel (i.e., P) with the magnetization state of the fixed region.

The spin-torque effect is known to those skilled in the art. The spin-polarized current from one magnetic region crosses the nonmagnetic intermediate region 30 and then, through conservation of spin angular momentum, exerts a spin torque on the other magnetic region. The direction of the current I represents the opposite direction of the flow of the electrons. A current (I) becomes spin-polarized after it passes through the first magnetic layer (i.e., fixed region 20 for the direction of current I shown in FIG. 1) in a magnet/non-magnet/magnet tri-layer structure (e.g., fixed region 20/intermediate region 30/free region 50 structure of FIG. 1), where fixed region 20 is substantially fixed in its magnetic orientation by any one of a number of methods known in the art. Since the magnetization of fixed region 20 is fixed, its magnetization does not switch. A fraction of the electrons will then reflect off of fixed region 20 and travel back across intermediate region 30 and interact with free region 50 and exert a spin torque on free region 50. In this case, the spin torque acts to switch the magnetic orientation of free region 50 to be antiparallel (AP) to the magnetic orientation of fixed region 20. If a current of the opposite polarity (e.g., in a direction opposite to the direction of the arrow in FIG. 1) is applied, the current passes first through free region 50 to fixed region 20, i.e., the electrons pass though the fixed region 20, cross the nonmagnetic intermediate region 30, and then, through conservation of spin angular momentum, exert a spin torque on free region 50. In this case, the spin torque acts to switch the magnetic orientation of free region 50 to be parallel (P) to the magnetic orientation of fixed region 20. Spin-torque switching occurs only when the magnitude of current I exceeds the critical current $I_C$ of MTJ bit 100. In a typical MTJ device 1000, the spin-torque switching current I (called write current $I_W$) used by the circuit is chosen to be somewhat above the average $I_C$ of the multiple MTJ bits 100 in device 1000 so that all MTJ bits 100 will switch reliably when current $I_W$ is applied. During reading of data from MTJ bit 100, a small current (e.g., read current) flows through MTJ bit 100, and the resistance of MTJ bit 100 (e.g., $R_{Min}(R_L)$, $R_{Max}(R_H)$, etc.) is detected. Similarly, the spin-orbit-torque switching requires a spin-hall material in contact with free region 50 of MTJ bit 100. By applying electrical current through the spin-hall material, due to spin-orbit coupling, a spin current is injected into free region 50, so free region 50 can be switched to a P or AP state, depending on the current polarity applied.

The mean current required to switch the magnetic state of the free region may be referred to as the critical current (Ic). The critical current density (Jc) is the average critical current per area of the MTJ bit (Jc=Ic/A), where A is the area, and the current supplied by the circuit to switch spin-torque MRAM elements in a memory array is the write current (Iw). The critical current is indicative of the current required to "write" data in (or the write current of) a magnetoresistive memory cell. As those of ordinary skill in the art will recognize, the write current may be larger than the critical current. For example, in some cases, the write current may be approximately 1.4 to 1.6 times larger than the critical current. Reducing the required write current(s) is desirable so that, among other things, a smaller access transistor can be used for each memory cell, and a higher density, lower cost memory can be produced.

Reducing the $I_C$ by lowering the area of the MTJ bit for a constant Jc reduces the magnetic energy barrier Eb separating the two stable states of the free region. Eb is proportional to the saturation magnetization Ms of the free region material, the anisotropy Hk of the free region, and the free region volume. Reducing the area may reduce volume and therefore Eb. Reducing Eb impacts the non-volatility of the MRAM, making it possible for the free region to undesirably switch via thermal fluctuations in the temperature range and during the operating life of the part. For a smaller MTJ size, a tall free region may thus be required to preserve a higher volume as area decreases, which, correspondingly, may increase shape anisotropy to achieve a higher Eb. To include a taller free region, a taller fixed region may also be needed, where the shape magnetic anisotropy can be helpful to reduce the probability of SAF flip.

Typically, in MRAM and related magnetic sensor technology, the fixed region is a synthetic anti-ferromagnet (SAF). SAF structures generally comprise two ferromagnetic regions (e.g., ferromagnetic regions 14, 18, as described above) of substantially similar magnetic moment, separated by a spacer region that provides anti-ferromagnetic coupling (e.g., spacer region 16, as described above) between them. Due to the anti-ferromagnetic coupling, the moments of the ferromagnetic layers may point in opposite directions in the absence of an applied magnetic field. The strength of the SAF is typically expressed in terms of the saturation field $H_{sat}$, which is the field needed to force the moments of the layers parallel to each other. A large magnetic anisotropy and saturation field is preferred to prevent SAF flip, i.e., a magnetization direction change of 180 degrees for both magnetic layers while still antiferromagnetically coupled.

To be magnetically rigid enough for practical use, the SAF structures may need to exhibit a high saturation field, as well as high flip field, to ensure that the magnetic moments of the fixed SAF do not switch while the free region is switching. Thus, it may be desirable for the SAF region to be stable and not overly sensitive to the magnetic field.

As MTJ bits decrease in size to allow for higher MTJ bit densities, it may be desirable to increase the height of the MTJ regions (e.g., the free and/or fixed regions) in order to increase shape anisotropy. Anisotropy may largely be dictated by the choice of materials used in SAF regions, however, with smaller-sized MTJ bits, the anisotropy derived from the materials may not be enough to due to the smaller amounts of materials used. Accordingly, embodiments of the present disclosure may manipulate the shape of individual regions in order to increase anisotropy.

For example, increasing the height of a free region and/or a fixed SAF region as the size of the free region and/or the SAF region decreases may maintain a higher anisotropy. Accordingly, in order to achieve a small MTJ size, a tall free region may be used in order to increase shape anisotropy for a higher energy barrier of small MTJ bits. Similarly, as discussed above, a tall SAF region may be needed in order to increase the volume of the SAF in order to create a more stable field, thereby increasing the stability of the SAF region (e.g., by increasing the energy barrier and/or increasing the flip field).

However, increasing the height of the magnetic regions that make up a SAF region (e.g., ferromagnetic regions AP1, AP2, as discussed above) may change the coupling field, leading to reduced exchange coupling field between the AP1 and AP2 layers of the SAF. The AP1 and AP2 layers may generate a magnetic field that affects the free region, which may be undesirable for stability, so it may be necessary to balance the moment between the AP1 and AP2 layers to obtain a stable SAF, or to minimize or otherwise adjust the magnetic field from SAF applied to the free region.

Embodiments of the present disclosure may solve at least some of the above issues by providing a SAF region with an increased overall height but in which individual layers within the SAF region are not substantially increased. For example, instead of including one SAF having layers of increased thickness, multiple SAFs, or SAFs with repeating AP regions and coupling regions, may be used in order to increase the SAF region volume without increasing the height, and thus the magnetic field, of individual SAF layers. Accordingly, aspects of the present disclosure are drawn to multilayer SAFs, as described in detail below.

FIG. 3A depicts an exemplary MTJ bit 200 having a first electrode 110 (e.g., a bottom electrode), a seed region 115, a ferromagnetic region 114a (e.g., the AP1 layer of a SAF), a coupling region 116, a ferromagnetic region 114b (e.g., the AP2 layer of the SAF), a transition region 122, a reference region 124, an intermediate region 130a, a free region 150, another intermediate region 130b, a spacer region 135, a cap region 140, and a second electrode 170 (top electrode). Those of ordinary skill in the art will understand that one or more of the regions in the preceding list may be omitted or otherwise combined with an adjacent region. Ferromagnetic region 114a (AP1), coupling region 116, ferromagnetic region 114b (AP2), transition region 122, and reference region 124 may form a fixed SAF region 120. As explained above, the exact arrangement and inclusion/exclusion of regions may vary, e.g., first and/or second electrodes 110, 170 may be eliminated, and MTJ bit 200 may be in direct contact with a metallization structure (e.g., line, via, etc.) of an MTJ device, or seed region 115 may be eliminated, and the top surface of electrode 110 itself may act as the seed layer.

As is shown in FIG. 3B, the fixed SAF region 120 of MTJ 200 may have an increased height by incorporating repeating layers of AP regions and coupling regions rather than substantially increasing the height of any individual AP region and/or coupling region. FIG. 3B shows a close-up cross-sectional view of an exemplary portion A of the fixed SAF region 120 of the MTJ bit 200 of FIG. 3A. As is depicted in FIG. 3B, fixed SAF region 120 includes any suitable number of alternating AP regions 114 (e.g., regions 114a, 114b) and coupling regions 116, depending on the desired height of the SAF region, which may be dependent on, or otherwise a function, of a diameter width dimension of MTJ 200. FIG. 3B depicts AP1 region 114a, coupling region 116a, AP2 region 114b, coupling region 116b, AP3 region 114c, coupling region 116c, and so on, until the desired number of coupling and AP regions (e.g., coupling region 116n and APn+1 region 114n+1) is achieved. Once the desired number of coupling and AP regions is included in the SAF to achieve a tall fixed region 120, transition region 122 and/or reference region 124 may be included on top of AP$_{n+1}$ region in in the SAF. It is contemplated that the repeated layers of the SAF regions described herein (e.g., multiple ferromagnetic regions and/or multiple coupling regions) may be formed of the same material or may be formed of different materials and/or may have substantially the same thicknesses or different thicknesses, or any combinations thereof. For example, different ferromagnetic regions may have the same or different composition and/or thickness, and/or different coupling regions may have the same or different compositions and/or thicknesses.

FIG. 4A depicts another exemplary MTJ bit 200 having a first electrode 110 (bottom electrode), a seed region 115, a ferromagnetic region 114a (AP1), a coupling region 116, a ferromagnetic region 114b (AP2), a transition region 122, a reference region 124, an intermediate region 130a, a free region 150, another intermediate region 130b, a cap region 140, and a second electrode 170 (top electrode). Ferromagnetic region 114a, coupling region 116, ferromagnetic region 114b, transition region 122, and reference region 124 may form a fixed region 120. Fixed region 120 may be a SAF, which includes, among other things, AP1, coupling region 116, and AP2. As explained above, the exact arrangement and inclusion/exclusion of regions may vary, e.g., first and/or second electrodes 110, 170 may be eliminated, and MTJ bit 200 may be in direct contact with a metallization structure (e.g., line, via, etc.) of an MTJ device, or seed region 115 may be eliminated, and the top surface of electrode 110 itself may act as the seed layer.

If free region 150 of MTJ bit 200 has an increased height, then the resulting tall free region 150 may require a tall SAF region with an increased height, as described above. In some embodiments, the height of a free region 150 and/or SAF region may be approximately 0.7 to 5 times greater than the width of MTJ bit 200. In some embodiments, the height of a free region 150 and/or SAF region may be approximately 0.8 to 4 times greater than the width of MTJ bit 200. For example, it may be desirable to reduce the size of MTJ bit 200 to, e.g., approximately 10-30 nm wide, e.g., to approximately 10, 15, 20, or 25 nm wide, rather than, e.g., approximately 60-100 nm wide. If a 20 nm MTJ bit 200 is used, then a free region 150 and/or SAF region of a height of greater than approximately 20 nm may be used, e.g., from approximately 30-40 nm tall. If a 10 nm MTJ bit 200 is used, then a free region 150 and/or SAF region having a height of over approximately 10 nm may be used, e.g., approximately 20-40 nm tall.

Again, increasing the height of a fixed SAF region may be accomplished by either (a) increasing the thickness of the magnetic layers of the SAF region (FIG. 4A), or (b) including multiple layers of coupling regions 116 and AP regions 114a, 114b (FIG. 4B). FIG. 4B depicts a tall SAF fixed region 120' with a low saturation field (H$_{sat}$) due to the increased heights of the AP regions 114a, 114b. Increasing the heights of the AP regions 114a, 114b may lead to reduced exchange coupling field between AP regions 114a, 114b, leading to unstable SAF (easy to flip magnetic moment direction), potentially resulting in an undesirable coupling to free region 150. By contrast, FIG. 4B depicts a number of repeated, alternating pairs of AP regions 114 (e.g., 114a/114b, 114c/114d, and 114c/114f) and coupling regions 116 (e.g., 116a-116e) within the SAF that makes up fixed region 120". Because the height of each region within the SAF fixed region 120" is not substantially increased, coupling through each of the regions remains relatively high, and the smaller magnetic fields generated by each region may offset one another by adjusting the thickness of each AP region.

Furthermore, the SAF stability can be further improved with strong coupling layer materials from coupling region 116 or intrinsic magnetic anisotropy of each AP layer.

FIG. 5 depicts an embodiment showing a multilayer SAF for a double-MTJ bit 300. In FIG. 5, two separate SAF fixed regions are used-top SAF 'T' and bottom SAF 'B'. Top SAF 'T' includes one standard SAF (including coupling region 116 between two AP regions 114), while bottom SAF 'B' includes a multilayer SAF having two coupling regions 116a/116b and three AP regions 114a/114b/114c, each AP region is 114 antiferromagnetically coupled with its adjacent magnetic region. The magnetizations of the two reference regions 124 may have magnetizations set into opposite directions. For example, AP1-bottom and AP1-top may have large moments compared with other magnetic regions in their respective SAFs. A large magnetic field may be applied (larger than a saturation magnetic field Hsat for the SAF) (as indicated by the arrow to the right of MTJ bit 300), so magnetizations of all magnetic regions may be aligned along the magnetic field direction. When the magnetic field is removed, the AP1-bottom and AP1-top regions with large moments may remain in the same direction as the magnetic field applied, and the magnetizations of the other magnetic regions may remain the same (AP3 bottom and reference region 124) or may rotate 180 degrees (AP2 bottom, AP2 top, and reference region 124) to allow them to antiferromagnetically align with their adjacent magnetic regions, so two reference regions 124 may have magnetization in opposite directions. Reference regions 124 may have different relative thicknesses from one another, e.g., the coupling field to free region 150 or MR from reference region 124 of the bottom SAF B may be larger than that of reference region 124 of the top SAFT. As is shown in FIG. 5, multiple SAF regions may be used in order to increase the height of SAF regions within an MTJ bit, and, of the multiple SAF regions used, one or more may incorporate repeating layers of AP regions and coupling regions, further increasing the height of the SAF regions included in the MTJ bit. This MTJ can be an in-plane MTJ with or without a pinning layer.

As discussed previously, the height of the tall free regions and tall SAF fixed regions may depend, at least in part, on the materials of the MTJ used and/or the width of the free regions and SAF fixed regions. For example, the height of the free and/or fixed regions may be similar to or larger than the width of the free and/or fixed regions. For example, the ratio of height to width of free and/or fixed regions may be in the range of 0.8 to 4, preferably 1 to 3.

FIGS. 6A-6H depict exemplary free regions 150a-150h (which may correspond to, e.g., free region 150 of MTJ bit 200, 300) according to aspects of the present disclosure. As has been previously described, embodiments of the present disclosure may additionally or alternately include a multilayer free region having increased height. Increasing the height of a free region may include (a) increasing the thickness of the magnetic layers of the free region, and/or (b) including multiple layers of coupling regions sandwiched between ferromagnetic regions.

Each ferromagnetic region within a free region may include either the same or different material(s) as other ferromagnetic region(s) within the free region, and/or may have the same or different thickness as other ferromagnetic region(s) within the free region. Moreover, each coupling region within a single free region may include either the same or different material(s) and/or the same or different thickness(es) as other coupling regions within the stack. Material(s) and/or thickness(es) of each coupling region may be adjusted to provide either antiferromagnetic coupling between ferromagnetic regions adjacent to the coupling region (e.g., to form an SAF region) or ferromagnetic coupling between ferromagnetic regions adjacent to the coupling region (e.g., to form an SyF region), as desired. Both SAF and SyF regions may be suitable for creating a relatively tall free region, either alone or in combination. For example, multiple SAF and SyF regions may be combined in a single stack to create a portion of a tall free region.

The strength and type of coupling in a free region may be adjusted through selection of material, thickness, or both material and thickness of a coupling region. The strength and type of coupling may be adjusted to, e.g., adjust free region spin transfer torque switching performance. Additionally or alternately, coupling region material(s) and/or thickness(es) may be chosen to promote or provide strong perpendicular magnetic anisotropy at the interface between the coupling region and an adjacent ferromagnetic region. Additionally or alternately, coupling region material(s) and/or thickness(es) may be chosen to provide or promote the growth of a ferromagnetic region on top of the coupling region, which may advantageously lead to a reduced damping constant for that ferromagnetic region and hence reduced damping for the whole free region, corresponding to a low STT switching current requirement.

While FIGS. 6A-6H depict exemplary free regions 150a-150h, each including a given number of ferromagnetic regions 154 separated by SAF coupling region(s) 152 or SyF coupling region(s) 153, it is to be understood that any suitable number of ferromagnetic regions 154 separated by coupling region(s) 152 or 153 may be included in a free region, e.g., to achieve a desired height or height-to-width ratio for the free region.

Figure 6B:
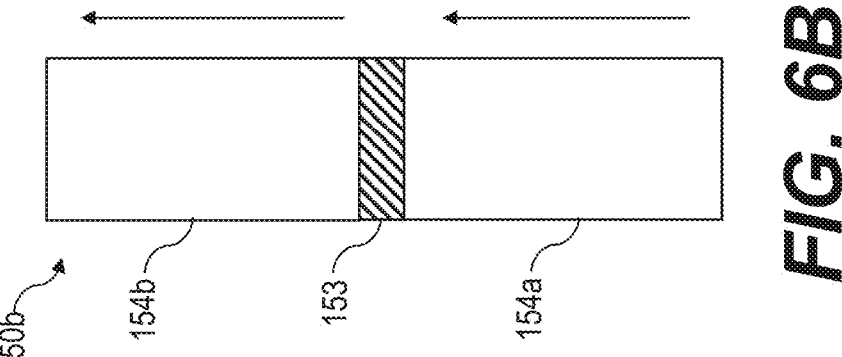
Figure 6A:
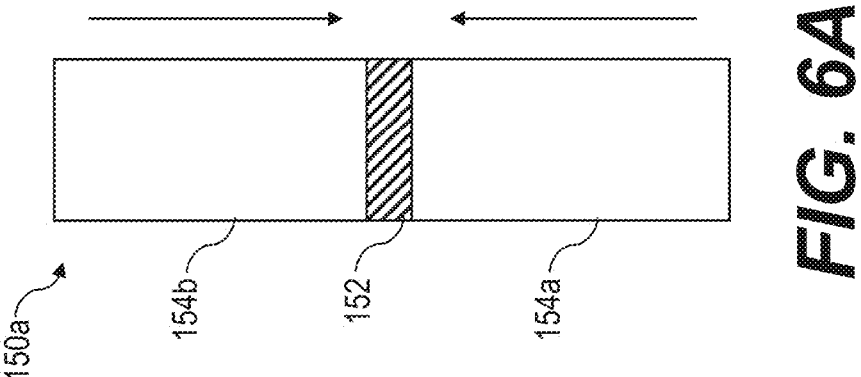

FIG. 6A depicts an exemplary SAF free region 150a, including a coupling region 152 in between a first ferromagnetic region 154a and a second ferromagnetic region 154b. Coupling region 152 may include a material and thickness suitable for making free region 150a a SAF region (e.g., such that ferromagnetic regions 154a and 154b are antiferromagnetically coupled, as indicated by the opposing arrows adjacent to each region).

FIG. 6B depicts an exemplary SyF free region 150b, including a coupling region 153 in between first ferromagnetic region 154a and second ferromagnetic region 154b. Coupling region 153 may include a material and thickness suitable for making free region 150a a SyF region (e.g., such that ferromagnetic regions 154a and 154b are ferromagnetically coupled, as indicated by the parallel arrows adjacent to each region).

Figure 6E:
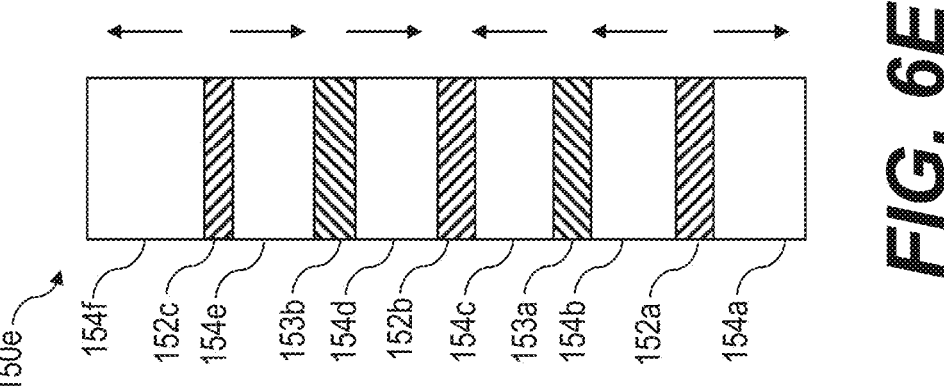
Figure 6D:
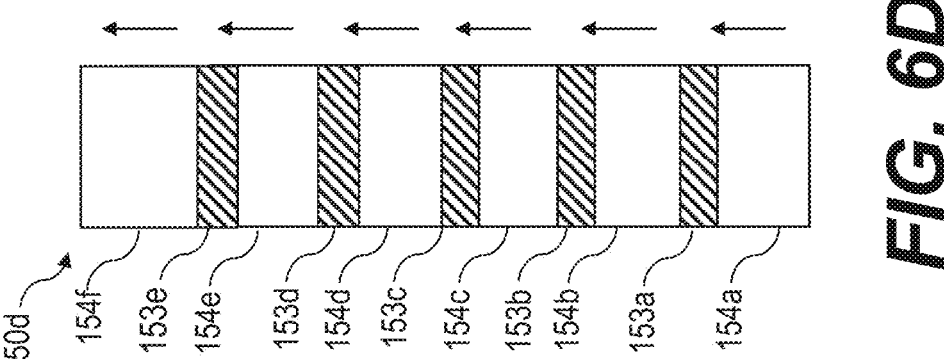
Figure 6C:
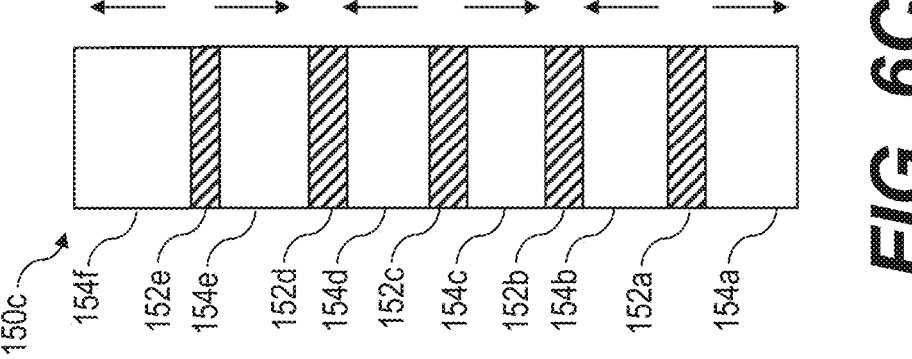

FIG. 6C depicts a further exemplary SAF free region 150c including ferromagnetic regions 154a, 154b, 154c, 154d, 154e, 154f separated by coupling regions 152a, 152b, 152c, 152d, 152c. Each of ferromagnetic regions 154a, 154b, 154c, 154d, 154c, 154f is antiferromagnetically coupled with a neighboring ferromagnetic region, creating a stack of multiple SAF regions within free region 150c.

FIG. 6D depicts a further exemplary SyF free region 150d including ferromagnetic regions 154a, 154b, 154c, 154d, 154e, 154f separated by coupling regions 153a, 153b, 153c, 153d, 153c. Each of ferromagnetic regions 154a, 154b, 154c, 154d, 154c, 154f is ferromagnetically coupled with a neighboring ferromagnetic region, creating a stack of multiple SyF regions within free region 150d.

FIG. 6E depicts a further exemplary free region 150e including ferromagnetic regions 154a, 154b, 154c, 154d, 154c, 154f separated by coupling regions 152a, 153a, 152b, 153b, 152c. Each of ferromagnetic regions 154a, 154b, 154c, 154d, 154c, 154f is coupled either ferromagnetically or antiferromagnetically with a neighboring ferromagnetic region, creating a stack of combined SAF and SyF regions within free region 150e (as indicated by the pattern of parallel/antiparallel arrows adjacent to free region 150c).

Figure 6H:
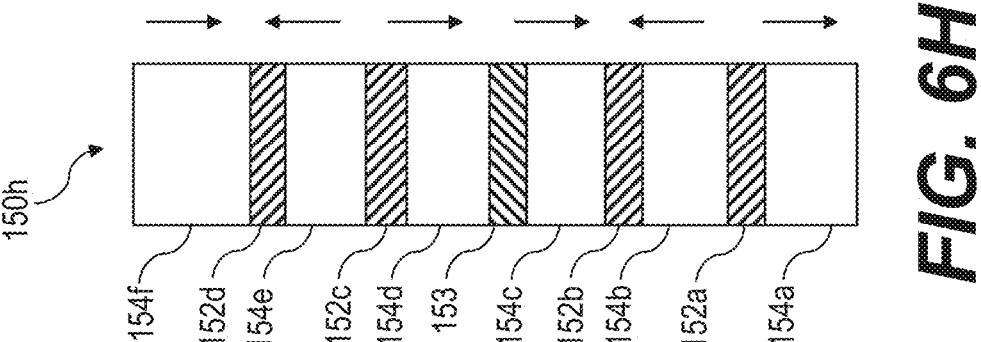
Figure 6G:
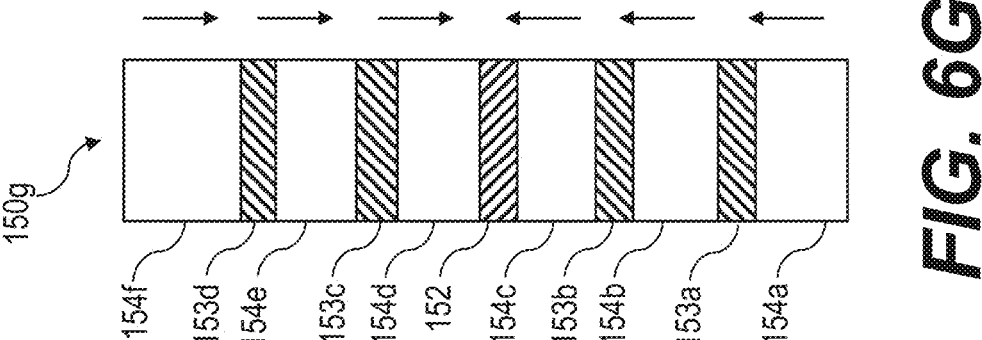
Figure 6F:
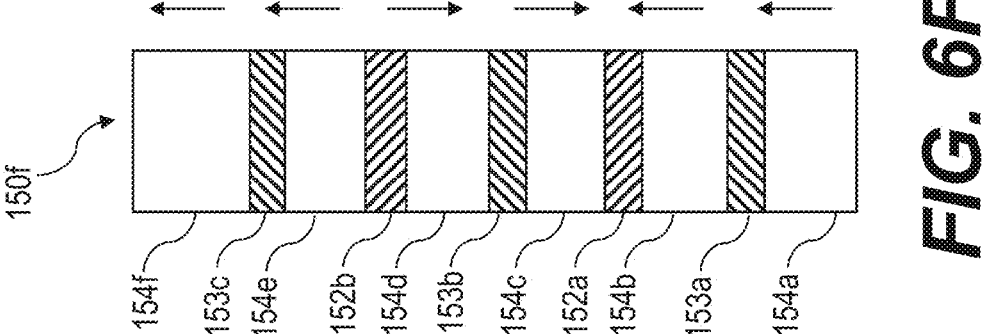

FIG. 6F depicts a further exemplary free region 150f including ferromagnetic regions 154a, 154b, 154c, 154d, 154e, 154f separated by coupling regions 153a, 152a, 153b, 152b, 153c. Each of ferromagnetic regions 154a, 154b, 154c, 154d, 154c, 154f is coupled either ferromagnetically or antiferromagnetically with a neighboring ferromagnetic region (in a pattern inverse to the pattern of ferromagnetic/antiferromagnetic coupling in free region 150e) creating another stack of combined SAF and SyF regions within free region 150f (as indicated by the pattern of parallel/antiparallel arrows adjacent to free region 150f).

FIG. 6G depicts a further exemplary free region 150g including ferromagnetic regions 154a, 154b, 154c, 154d, 154c, 154f separated by coupling regions 153a, 153b, 152, 153c, 153d. Each of ferromagnetic regions 154a, 154b, 154c, 154d, 154c, 154f is coupled either ferromagnetically or antiferromagnetically with a neighboring ferromagnetic region, creating a stack of combined SAF and SyF regions within free region 150g (as indicated by the pattern of parallel/antiparallel arrows adjacent to free region 150g). Specifically, only one coupling region 152 antiferromagnetically couples adjacent ferromagnetic regions 154c, 154d, whereas each other coupling region 153a, 153b, 153c, 153d ferromagnetically couples its adjacent ferromagnetic regions.

FIG. 6H depicts a further exemplary free region 150h including ferromagnetic regions 154a, 154b, 154c, 154d, 154c, 154f separated by coupling regions 152a, 152b, 153, 152c, 152d. Each of ferromagnetic regions 154a, 154b, 154c, 154d, 154c, 154f is coupled either ferromagnetically or antiferromagnetically with a neighboring ferromagnetic region, creating a stack of combined SAF and SyF regions within free region 150h (as indicated by the pattern of parallel/antiparallel arrows adjacent to free region 150h). Specifically, and inverse to the pattern depicted with respect to free region 150g, only one coupling region 153 ferromagnetically couples adjacent ferromagnetic regions 154c, 154d, whereas each other coupling region 152a, 152b, 152c, 152d antiferromagnetically couples the adjacent ferromagnetic regions.

The free regions 150a-150h depicted in FIGS. 6A-6H may each demonstrate particular critical current, spin-transfer torque critical switching current efficiencies, perpendicular magnetic anisotropy, and/or other characteristics which may render them suitable for use as free regions in an MTJ bit (e.g., MTJ bit 200, 300).

Ferromagnetic regions 154 (e.g., 154a, 154b, 154c, 154d, 154c, 154f) in any of free regions 150a-150h (or any other like free region) may include, e.g., one or more of the ferromagnetic elements nickel (Ni), iron (Fe), and cobalt (Co), including alloys or engineered materials with one or more of the elements palladium (Pd), platinum (Pt), nickel (Ni), tantalum (Ta), molybdenum (Mo), tungsten (W), zirconium (Zr), hafnium (Hf), boron (B), carbon (C), or alloys thereof (e.g. CoFeB, CoFeNiB, CoFcMoB, FeB, CoB, NiB, etc). In some embodiments, ferromagnetic regions 154 may comprise a magnetic multi-layer structure that includes a plurality of layers of a first ferromagnetic material (e.g., cobalt (Co)) and a second ferromagnetic material (e.g., nickel (Ni)) or a paramagnetic material (e.g., platinum (Pt)). Additionally or alternately, ferromagnetic regions 154 may include, for example, alloys or engineered materials with one or more of palladium (Pd), platinum (Pt), magnesium (Mg), manganese (Mn), and chromium (Cr).

Suitable materials for coupling regions in free regions 150a-150h may include, e.g., tantalum (Ta), titanium (Ti), vanadium (V), chromium (Cr), zirconium (Zr), niobium (Nb), molybdenum (Mo), hafnium (Hf), tungsten (W), iridium (Ir), ruthenium (Ru), osmium (Os), platinum (Pt), palladium (Pd), etc. Additionally or alternatively, coupling regions in free regions 150a-150h may include one or more oxides, nitrides, or oxynitrides, such as aluminum oxide (AlOx), magnesium oxide (MgOx), ruthenium oxide (RuOx), molybdenum oxide (MoOx), tungsten oxide (WOx), chromium oxide (CrOx), hafnium oxide (HfOx), zirconium oxide (ZrOx), tantalum oxide (TaOx), and/or titanium oxide (TiOx). Additionally or alternatively, coupling regions may include magnesium ([A]) oxide (Mg[A] Ox), where X may be tungsten (W), molybdenum (Mo), ruthenium (Ru), chromium (Cr), hafnium (Hf), zirconium (Zr), titanium (Ti), Aluminum (Al) and the like, Advantageously, such oxides may assist in providing perpendicular magnetic anisotropy and providing a region with low resistance-area (RA) product.

FIG. 7 depicts a flow chart of an exemplary method 301 of fabricating MTJ bit 100, 200, 300 (of FIGS. 1, 2, 3A, 4A, 5, and 6A-6H), according to the present disclosure. A first electrode (e.g., bottom electrode 10, 110) may be first formed on the backend (surface with circuitry) of a semiconductor substrate by any suitable process (step 310). A fixed region 20, 120 then may be formed on or above an exposed surface of electrode 10, 110 (step 320). In embodiments where fixed region 20, 120 is a multilayer SAF that includes multiple stacked SAF regions, fixed region 20, 120 may be formed by providing (e.g., sequentially) the different regions (coupling regions 1 through n and AP1, AP2, . . . $AP_{n+1}$) that comprise the fixed region 20, 120 on or above the surface of electrode 10, 110. An intermediate region 30, 130 then may be formed on or above an exposed surface of fixed region 20, 120 (step 330). A free region 50, 150 (which may be a tall free region) may then be formed on or above the exposed surface of the intermediate region 30, 130 (step 340). In embodiments where free region 50, 150 is a multilayer SAF, SyF, or combined SAF/SyF stack, free region 50, 150 may be formed by providing (e.g., sequentially providing) the different regions that comprise the free region 50, 150. Second electrode 70, 170 may now be formed on an exposed surface of free region 50, 150 (step 350). As those of ordinary skill in the art will readily recognize, method 301 may be appropriately modified to provide for the formation of any additional layers or regions.

Any suitable process may be used to form the different regions of MTJ bit 100, 200, 300. In some embodiments, forming the different regions may include depositing the material of the region by, for example, physical vapor deposition (e.g., ion beam sputtering, magnetron sputtering, etc.), chemical vapor deposition, plasma-enhanced chemical vapor deposition, etc. Formation of some or all of the regions may also involve known processing steps such as, for example, selective deposition, photolithography processing, etching, annealing, etc., in accordance with any of the various conventional techniques known in the semiconductor industry. In some embodiments, during deposition of the fixed and/or free regions 20, 120 and 50, 150, a magnetic field may be applied to set a preferred easy magnetization axis of the region (e.g., via induced anisotropy). Similarly, a strong magnetic field applied during the post-deposition high-temperature anneal step may be used to induce a preferred easy magnetization axis and/or a preferred pinning direction for any antiferromagnetically pinned materials or exchange coupled pinning materials. Since these techniques are known to those of ordinary skill in the art, they are not described here in greater detail.

Magnetoresistive devices can be included on an integrated circuit along with other circuitry. In such cases, it may be desirable to align the process steps and structures associated with the magnetoresistive devices with the process steps and circuit features associated with the surrounding circuitry. In other words, it may be desirable to integrate the manufacture of the magnetoresistive devices into the standard process flow used to manufacture the integrated circuits to minimize the number of additional processing steps and materials needed during production. For example, while some process steps and materials associated with building magnetoresistive devices may be specific to such devices, other process steps and materials used in manufacturing magnetoresistive devices also may be used in manufacturing the surrounding circuitry. As a specific example, conductive layers that are deposited and patterned to form the top and/or bottom electrodes for magnetoresistive devices can also be used to form connective traces and interlayer connections in standard complementary metal oxide semiconductor (CMOS) process flows. Interlayer dielectric used in the portion of the integrated circuit that includes magnetoresistive devices may be the same standard-process-flow interlayer dielectric used in the remainder of the integrated circuit. Such reuse eliminates the need for additional magnetoresistive-device-specific processing and materials.

FIG. 8 illustrates an exemplary integrated circuit (IC) device 400 that includes a logic portion 210 and a magnetoresistive device portion 220. Logic portion 210 may include logic circuits and other circuits typically manufactured using conventional process flows. The magnetoresistive device portion 220 may include one or more magnetoresistive devices such as, for example, magnetic memory devices (MRAMs), magnetic sensors, magnetic transducers, etc. For brevity, the magnetoresistive device portion 220 is hereinafter referred to as the memory portion 220. Magnetoresistive device portion 220 may include any suitable magnetoresistive device. The logic portion 210 may include logic circuit elements that may be inter-coupled using a plurality of metal layers (often referred to as M1, M2, M3, etc.). The multiple layers of metal may be vertically spaced-apart from each other and separated by a dielectric material (called interlayer dielectric or ILD). In order to provide electrical coupling between these multiple metal layers (and circuit elements), vias may be formed through the ILD that separates adjacent metal layers. Vias are holes or openings in the ILD within which electrically conductive material is deposited or otherwise provided in order to provide an electrical path between two metal layers on either side of the ILD. In some aspects, the ILD may surround and insulate the vias and/or interconnect wiring of the IC device 400.

Any suitable method may be used to form the different regions of the MTJ bits and MTJ devices described herein. Since suitable integrated circuit fabrication techniques (e.g., deposition, sputtering, evaporation, plating, etc.) that may be used to form the different regions are known to those of ordinary skill in the art, they are not described here in great detail. In some embodiments, forming some of the regions may involve thin-film deposition processes, including, but not limited to, physical vapor deposition techniques such as ion beam sputtering and magnetron sputtering. And, forming thin insulating layers (e.g., the intermediate region 30, which forms a tunnel barrier) may involve physical vapor deposition from an oxide target, such as by radio-frequency (RF)

sputtering, or by deposition of a thin metallic film followed by an oxidation step, such as oxygen plasma oxidation, oxygen radical oxidation, or natural oxidation by exposure to a low-pressure oxygen environment.

In some embodiments, formation of some or all of the regions of the described magnetoresistive stacks (e.g., magnetoresistive stack 100, 200, 300) may also involve known processing steps such as, for example, selective deposition, photolithography processing, etching, etc., in accordance with any of the various conventional techniques known in the semiconductor industry. In some embodiments, during deposition of the disclosed "fixed" and free regions, a magnetic field may be provided to set a preferred easy magnetization axis of the region (e.g., via induced anisotropy). Similarly, a strong magnetic field applied during the post-deposition high-temperature anneal step may be used to induce a preferred easy magnetization axis and a preferred pinning direction for any antiferromagnetically pinned materials.

As alluded to above, the magnetoresistive devices of the present disclosure, including one or more switching geometries described herein, may be implemented in a sensor architecture or a memory architecture (among other architectures). For example, in a memory configuration, the magnetoresistive devices may be electrically connected to an access transistor and configured to couple or connect to various conductors, which may carry one or more control signals, as shown in FIG. 9. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 10A) or an embedded memory device having a logic therein (e.g., as shown in FIG. 10B), each including MRAM, which, in one embodiment is representative of one or more arrays of MRAM having a plurality of magnetoresistive stacks, according to certain aspects of certain embodiments disclosed herein.

Aspects of the present disclosure are directed to an MTJ bit. The MTJ bit may comprise an SAF fixed region, including a plurality of anti-parallel regions and a plurality of coupling regions, wherein each coupling region is disposed between two of the plurality of anti-parallel regions, and wherein a height of the SAF fixed region is greater than or equal to a width of the SAF fixed region. Additionally, in some cases, the height of the SAF fixed region may be greater than approximately 10 nm. Additionally or alternatively, the height of the SAF fixed region may be between approximately 20 nm and approximately 40 nm. Additionally or alternatively, the SAF fixed region may include at least four anti-parallel regions. In some cases, the MTJ bit may include a free region, wherein a height of the free region is approximately equal to the height of the SAF fixed region. Additionally or alternatively, the height of the SAF fixed region may be between 1 and 3 times greater than the width of the SAF fixed region.

Additionally or alternatively, the SAF fixed region may be a first SAF fixed region, and the MTJ bit may further include a second SAF fixed region, including two anti-parallel regions and a coupling region disposed between the anti-parallel regions, and a free region, wherein the first SAF fixed region and the second SAF fixed region may be disposed on opposite sides of the free region. Additionally or alternatively, each coupling region may include one of iridium, ruthenium, rhenium, or rhodium.

In further aspects of the present disclosure, an MTJ bit may include an SAF fixed region, including a plurality of anti-parallel regions, wherein each anti-parallel region comprises a plurality of layers of a first ferromagnetic material and a second ferromagnetic material, and a plurality of coupling regions, wherein each coupling region is disposed between two of the plurality of anti-parallel regions, and wherein a height of the SAF fixed region is greater than or equal to a width of the SAF fixed region. Additionally or alternatively, each of the first ferromagnetic material and the second ferromagnetic material may include at least one of cobalt, nickel, and iron. Additionally or alternatively, each anti-parallel region may further include an alloy or engineered material including one or more of palladium, platinum, magnesium, manganese, and chromium. Additionally or alternatively, a width of the MTJ bit may be between approximately 10 nm and approximately 30 nm.

In some aspects of the present disclosure, an MTJ bit may include an SAF fixed region including a plurality of anti-parallel regions and a plurality of coupling regions, wherein each coupling region is disposed between two of the plurality of anti-parallel regions. The MTJ bit may further include a free region, including a plurality of ferromagnetic regions and a plurality of coupling regions, wherein each coupling region is disposed between two of the plurality of ferromagnetic regions. The MTJ bit may further include an intermediate region disposed between the SAF fixed region and the free region, wherein a height of the SAF fixed region is greater than or equal to a width of the SAF fixed region, and a height of the free region is greater than or equal to a width of the free region.

Additionally or alternatively, the free region may include both synthetic antiferromagnetic coupling regions and synthetic ferromagnetic coupling regions. Additionally or alternatively, the free region may include exactly one synthetic antiferromagnetic coupling region. Additionally or alternatively, the free region may include no more than two synthetic ferromagnetic coupling regions. Additionally or alternatively, the free region may include both synthetic antiferromagnetic coupling regions and synthetic ferromagnetic coupling regions in an alternating configuration. Additionally or alternatively, each of the plurality of coupling regions in the free region may include at least one of aluminum, magnesium, tantalum, titanium, vanadium, chromium, zirconium, niobium, molybdenum, hafnium, tungsten, iridium, ruthenium, palladium, rhenium, rhodium, osmium, platinum, and an alloy thereof. Additionally or alternatively, the height of the free region may be approximately equal to the height of the SAF fixed region.

Aspects of the present disclosure may include a method of preparing an MTJ bit. The method may include forming a multilayer SAF fixed region on a substrate by alternately depositing anti-parallel regions and coupling regions, forming an intermediate region over the SAF fixed region, and forming a multilayer free region by alternately depositing ferromagnetic regions and coupling regions over the intermediate region.

In some cases, the step of forming a multilayer SAF fixed region may include depositing at least three anti-parallel regions. Additionally or alternatively, the step of forming a multilayer free region may include depositing at least three ferromagnetic regions. Additionally or alternatively, the step of forming a multilayer free region may include depositing at least one coupling region to ferromagnetically couple two adjacent ferromagnetic regions. Additionally or alternatively, the step of forming a multilayer free region may further include depositing at least one coupling region to antiferromagnetically couple two adjacent ferromagnetic regions. Additionally or alternatively, the step of forming a multilayer free region may include depositing at least one coupling region including one or more of aluminum, magnesium, tantalum, titanium, vanadium, chromium, zirconium, niobium, molybdenum, hafnium, tungsten, iridium, ruthenium, palladium, rhenium, rhodium, osmium, platinum, and/or an alloy, oxide, nitride, and/or oxynitride thereof.

Although various embodiments of the present disclosure have been illustrated and described in detail, it will be readily apparent to those skilled in the art that various modifications may be made without departing from the present disclosure.

What is claimed is:

1. A magnetic tunnel junction (MTJ) bit, comprising:
a synthetic antiferromagnetic (SAF) fixed region including:
    a first anti-parallel region and a second anti-parallel region; and
    a coupling region, wherein the coupling region is disposed between the first and second anti-parallel regions, and wherein a height of the SAF fixed region is greater than or equal to a width of the SAF fixed region; and
a free region including a second coupling region, the second coupling region including a synthetic antiferromagnetic coupling region and a synthetic ferromagnetic coupling region.

2. The MTJ bit of claim 1, wherein the SAF fixed region comprises at least four anti-parallel regions.

3. The MTJ bit of claim 1, wherein the height of the SAF fixed region is greater than approximately 10 nm.

4. The MTJ bit of claim 1, wherein the height of the SAF fixed region is between approximately 20 nm and approximately 40 nm.

5. The MTJ bit of claim 1,
wherein a height of the free region is approximately equal to the height of the SAF fixed region.

6. The MTJ bit of claim 1, wherein the height of the SAF fixed region is between 1 and 3 times greater than the width of the SAF fixed region.

7. The MTJ bit of claim 1, wherein the SAF fixed region is a first SAF fixed region, and further comprising:
a second SAF fixed region including:
    two anti-parallel regions; and
    a coupling region disposed between the two anti-parallel regions;
wherein the first SAF fixed region and the second SAF fixed region are disposed on opposite sides of the free region.

8. The MTJ bit of claim 1, wherein the coupling region includes one of iridium, ruthenium, rhenium, or rhodium.

9. The MTJ bit of claim 1, wherein the SAF fixed region is a first SAF fixed region, and the MTJ bit further comprises:
a second SAF fixed region including:
    two anti-parallel regions; and
    a coupling region disposed between the two anti-parallel regions,
wherein the coupling region of the second SAF fixed region includes one of iridium, ruthenium, rhenium, or rhodium.

10. A magnetic tunnel junction (MTJ) bit, comprising:
a synthetic antiferromagnetic (SAF) fixed region including:

a first anti-parallel region and a second anti-parallel region, wherein each of the first and second anti-parallel regions comprises one or more layers of a first ferromagnetic material and a second ferromagnetic material; and
    a coupling region,
    wherein the coupling region is disposed between the first and second anti-parallel regions; and
a free region including one or more synthetic antiferromagnetic coupling regions and one or more synthetic ferromagnetic coupling regions.

11. The MTJ bit of claim 10, wherein the SAF fixed region comprises at least four anti-parallel regions.

12. The MTJ bit of claim 10, wherein each of the first ferromagnetic material and the second ferromagnetic material comprises at least one of cobalt, nickel and iron.

13. The MTJ bit of claim 10, wherein each of the first and second anti-parallel regions further comprises an alloy or engineered material including one or more of palladium, platinum, magnesium, manganese, and chromium.

14. The MTJ bit of claim 10, wherein a width of the MTJ bit is between approximately 10 nm and approximately 30 nm.

15. A magnetic tunnel junction (MTJ) bit, comprising:
a synthetic antiferromagnetic (SAF) fixed region including:
    a first anti-parallel region and a second anti-parallel region; and
    a first coupling region, wherein the first coupling region is disposed between the first and second anti-parallel regions;
a free region, including:
    a first ferromagnetic region and a second ferromagnetic region; and
    a second coupling region, wherein the second coupling region includes one or more synthetic antiferromagnetic coupling regions and one or more synthetic ferromagnetic coupling regions, wherein the second coupling region is disposed between the first and second ferromagnetic regions; and
an intermediate region disposed between the SAF fixed region and the free region, wherein a height of the SAF fixed region is greater than or equal to a width of the SAF fixed region, and a height of the free region is greater than or equal to a width of the free region.

16. The MTJ bit of claim 15, wherein the free region includes exactly one synthetic antiferromagnetic coupling region.

17. The MTJ bit of claim 15, wherein the free region includes no more than two synthetic ferromagnetic coupling regions.

18. The MTJ bit of claim 15, wherein the free region includes the one or more synthetic antiferromagnetic coupling regions and the one or more synthetic ferromagnetic coupling regions in an alternating configuration.

19. The MTJ bit of claim 15, wherein the second coupling region in the free region includes one of aluminum, magnesium, tantalum, titanium, vanadium, chromium, zirconium, niobium, molybdenum, hafnium, tungsten, iridium, ruthenium, palladium, rhenium, rhodium, osmium, platinum, or an alloy thereof.

20. The MTJ bit of claim 15, wherein the height of the free region is approximately equal to the height of the SAF fixed region.

* * * * *